(12) United States Patent
Kitazawa

(10) Patent No.: US 7,361,876 B2
(45) Date of Patent: Apr. 22, 2008

(54) LINE HEAD AND IMAGE FORMING APPARATUS

(75) Inventor: Takayuki Kitazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 59 days.

(21) Appl. No.: 11/186,984

(22) Filed: Jul. 22, 2005

(65) Prior Publication Data

US 2006/0065812 A1  Mar. 30, 2006

(30) Foreign Application Priority Data

Sep. 30, 2004  (JP) ............................. 2004-289226

(51) Int. Cl.
*H01L 27/00* (2006.01)
*G01J 1/44* (2006.01)
*G09G 3/14* (2006.01)
*G09G 3/10* (2006.01)

(52) U.S. Cl. .............................. 250/208.1; 250/214 R; 345/39; 315/169.1

(58) Field of Classification Search ................ 313/498, 313/504, 506, 512; 315/167, 168, 169.1, 315/169.3; 250/208.1, 214 R, 214 LS; 345/39, 345/45, 46

See application file for complete search history.

(56) References Cited

U.S. PATENT DOCUMENTS

| | | | | |
|---|---|---|---|---|
| 6,091,203 A * | 7/2000 | Kawashima et al. | ..... | 315/169.3 |
| 6,864,863 B2 * | 3/2005 | Kasai | ..... | 345/39 |
| 6,960,890 B2 * | 11/2005 | Yoneda | ..... | 315/169.3 |
| 7,142,804 B2 * | 11/2006 | Goto et al. | ..... | 399/343 |
| 2006/0022601 A1 * | 2/2006 | Kitazawa | ..... | 315/169.1 |

FOREIGN PATENT DOCUMENTS

JP  A 11-274569  10/1999

* cited by examiner

*Primary Examiner*—Georgia Epps
*Assistant Examiner*—Don Williams
(74) *Attorney, Agent, or Firm*—Oliff & Berridge, PLC

(57) ABSTRACT

A line head includes a light-emitting element line in which a plurality of light-emitting elements, each being interposed between one electrode and another electrode, are arranged; and driving circuits that drive the light-emitting elements on the light-emitting element line, respectively. A power supply wiring line connected to the one electrode through each of the driving circuits is arranged opposite to the other electrode.

7 Claims, 6 Drawing Sheets

LINE HEAD AND IMAGE FORMING APPARATUS

BACKGROUND

The present invention relates to a line head and an image forming apparatus.

A line head has been used as a device which is incorporated into an electrophotographic image forming apparatus, such as a copying machine or a printer, to form (expose) an electrostatic latent image on the surface of a photoconductor. The line head includes a plurality of light-emitting elements one-dimensionally arrayed on a substrate, and drives the respective light-emitting elements through wiring lines patterned on the substrate. Light-emitting diodes (LEDs) or organic electroluminescent (EL) light-emitting elements have been employed as the light-emitting elements of the line head. For example, Japanese Unexamined Patent Application Publication No. 11-274569 discloses a light-emitting element array corresponding to the line head and an image forming apparatus.

However, in a light-emitting element panel used for the line head, data lines and control signal lines are generally provided along the arrayed direction of light-emitting elements. Since wiring lines of the line head have, for example, lengths of several tens of centimeters, it is necessary to stabilize the power. In particular, in a case in which organic EL light-emitting elements are used as light-emitting elements, a large amount of current is needed as compared to a case in which LEDs are used as light-emitting elements. As a result, since the wiring lines become thick, it is necessary to improve stabilization of the power.

SUMMARY

An advantage of the invention is that it provides a line head and an image forming apparatus in which power supplied to light-emitting elements is stabilized.

According to an aspect of the invention, a line head includes a light-emitting element line in which a plurality of light-emitting elements, each being interposed between one electrode and another electrode, are arranged; and driving circuits that drive the light-emitting elements on the light-emitting element line, respectively. A power supply wiring line connected to the one electrode through each of the driving circuits is arranged opposite to the other electrode.

According to the invention, the power supply wiring line and the other electrode constitute a capacitor, so that it is possible to stabilize the power.

Further, in the above-mentioned structure, it is preferable that thin film transistors be used as the driving circuits, and that the power supply wiring line be connected to a gate-terminal-layer wiring line formed on the same layer as gate terminals of the thin film transistors.

According to the invention, the power supply wiring line and the gate-terminal-layer wiring line are connected to each other, so that a capacitor is formed between a region in which the power supply wiring line and the gate-terminal-layer wiring line are provided and a region in which the other electrode is formed. Therefore, it is possible to form a capacitor having a further larger capacitance, as compared to a case in which a capacitor is formed only between the power supply wiring line and the other electrode. As a result, the power can be stabilized.

Furthermore, in the above-mentioned structure, it is preferable that organic EL light-emitting elements be used as the light-emitting elements.

As such, even when the organic EL light-emitting elements, which need a large amount of current, are used as the light-emitting elements, according to the invention, the capacitor is formed at least between the power supply wiring line and the other electrode, so that the power can be stably supplied to the organic EL light-emitting elements.

In addition, according to another aspect of the invention, an image forming apparatus includes photoconductors; charging units that uniformly charge the photoconductors; exposing units that include the above-mentioned line head and that expose the photoconductors, thereby forming, on the photoconductors, electrostatic latent images of images to be formed; developing units that develop the electrostatic latent images formed on the photoconductors as toner images; transfer units that transfer the toner images formed on the photoconductors onto a transfer medium; and photographic fixing units that fix the toner image formed on the transfer medium.

According to the invention, the power supplied to the light-emitting elements can be stabilized, so that it is possible to prevent troubles from occurring and to realize a stable operation.

Moreover, it is preferable that the image forming apparatus form color images.

According to the invention, it is possible to stabilize the power in the line head for forming the color images, so that it is possible to prevent troubles from occurring and to realize a stable operation.

BRIEF DESCRIPTION OF THE DRAWINGS

The invention will be described with reference to the accompanying drawings, wherein like numbers reference like elements, and wherein.

DETAILED DESCRIPTION OF EMBODIMENTS

Hereinafter, a line head and an image forming apparatus according to preferred embodiments of the invention will be described with reference to the accompanying drawings.

First Embodiment

Figure 1:
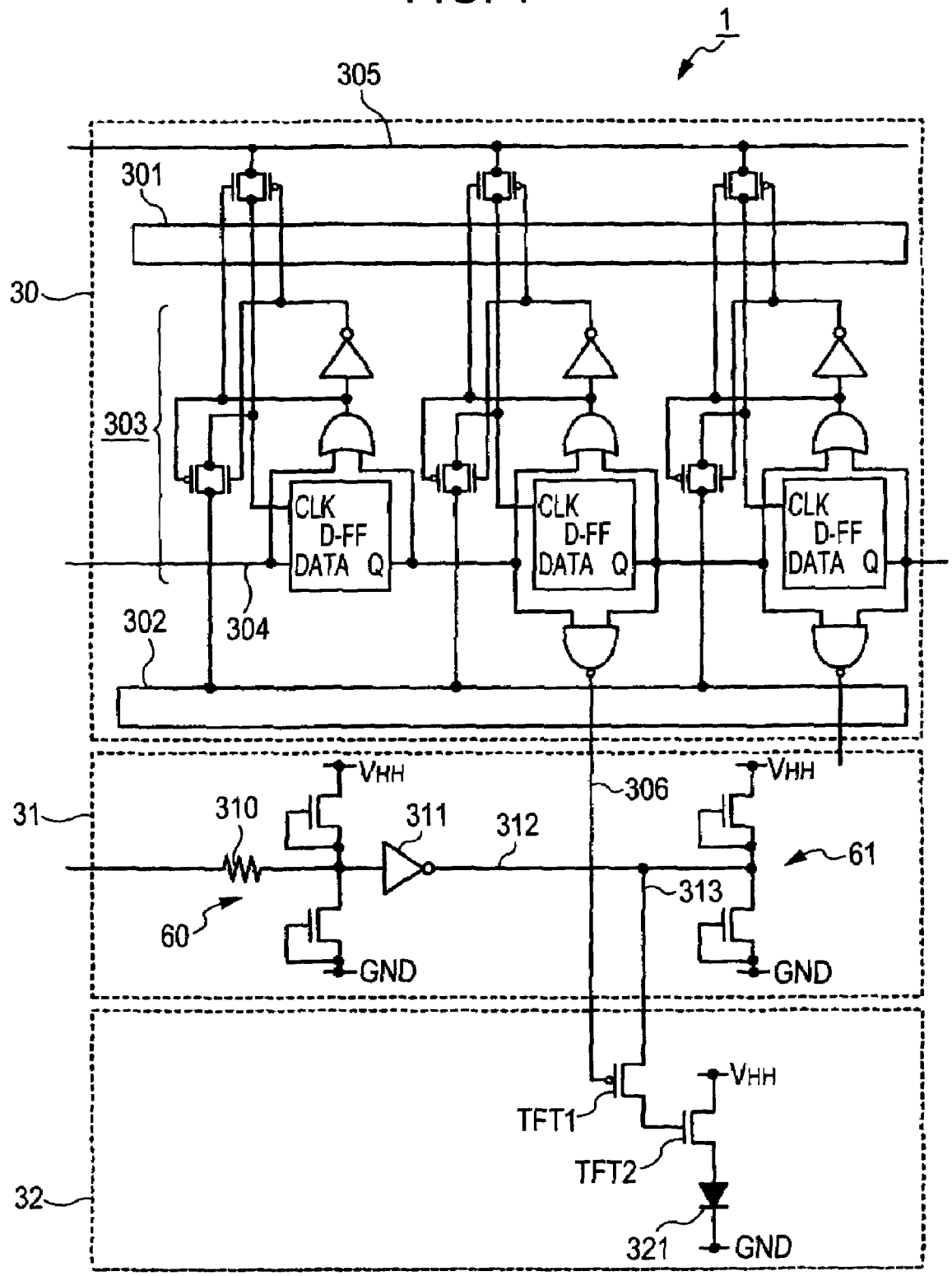
FIG. 1 is a circuit diagram schematically illustrating a circuit configuration of a line head according to a first embodiment of the invention.

FIG. 1 is a circuit diagram schematically illustrating a circuit configuration of a line head 1 according to the present embodiment. The line head 1 is mainly composed of a selection circuit 30, a data line unit 31, and a pixel circuit 32. The selection circuit 30 includes shift registers 303 for sequentially driving the pixel circuits 32, a power supply wiring line 301, and a ground wiring line 302. The shift registers 303 sequentially transmit start signals, supplied to an initial stage thereof through a start signal line 304, to subsequent stages thereof in synchronization with clock signals of a clock signal line 305, and supply output signals at respective stages to the pixel circuits 32 through gate lines 306 as selection signals for sequentially selecting light-emitting elements 321 in the pixel circuits 32.

The data line unit 31 is a wiring line unit which transmits data signals for emitting/non-emitting the light-emitting elements 321 through protective resistors 310 and input buffers 311 provided at the data lines 312. These data signals are supplied to the data lines 312 from outside in synchronization with the clock signals, and then are supplied to the pixel circuits 32 through lead lines 313. In addition, for the data line 312, an ESD protective element 60 is provided between the protective resistor 310 and the input buffer 311 and an ESD protective element 61 is provided at a front end of the data line 312.

The pixel circuit 32 is composed of a retaining transistor TFT1, a driving transistor TFT2 (driving circuit), and a light-emitting element 321. The retaining transistor TFT1 has a gate connected to the gate line 306, a source connected to the lead line 313, and a drain connected to a gate of the driving transistor TFT2. Moreover, the driving transistor TFT2 has a source connected to a power supply, that is, the power supply wiring line 301, and a drain connected to an anode terminal of the light-emitting element 321. In other words, the anode terminal of the light-emitting element 321 is connected to the power supply wiring line 301 through the driving transistor TFT2. Although the light-emitting element 321 is, for example, an organic EL light-emitting element in which a luminous body is made of an organic material, the light-emitting element 321 may be an LED. A cathode terminal of the light-emitting element 321 is connected to a GND, that is, the ground wiring line 302.

The light-emitting element 321 in such a pixel circuit 32 is selected by a selection signal input through the gate line 306 from the shift register 303, and the emission/non-emission thereof is controlled according to the data signal input through the data line 312 and the lead line 313. In other words, the shift registers 303 sequentially transmit the start signals to the subsequent stages in synchronization with clock signals thereby selecting the light-emitting elements 321. The emission/non-emission of the light-emitting elements 321 selected by the shift registers 303 is controlled according to voltage levels of the data signals, that is, L (low) or H (high) levels of the data signals.

Further, although only one light-emitting element 321 is shown in FIG. 1, in reality, n (for example, 5120) light-emitting elements 321 are arranged in one line on a substrate. Also, these n light-emitting elements 321 form blocks each of which is composed of m (for example, 128) light-emitting elements 321, and each block is selected by selection signals output from respective stages of the shift registers 303.

Figure 2:
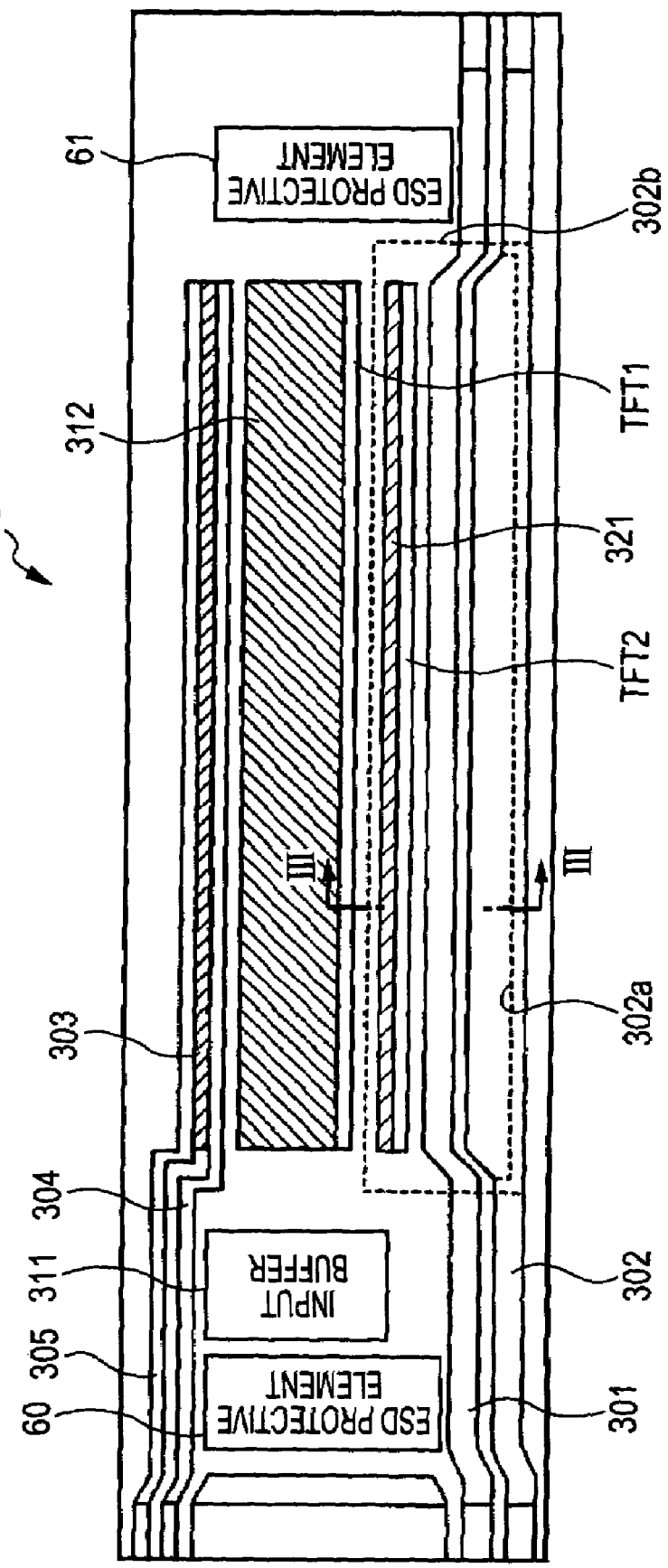
FIG. 2 is a schematic diagram illustrating a circuit layout of the line head according to the first embodiment of the invention.

Next, FIG. 2 is a schematic diagram illustrating a circuit layout of the line head 1 according to the present embodiment. In FIG. 2, components corresponding to those in FIG. 1 are denoted by the same reference numerals.

As shown in FIG. 2, the light-emitting elements 321, which are arranged in one line, are provided as a light-emitting element line parallel to a long side of a rectangular substrate. Below the light-emitting elements 321, the driving transistors TFT2, which are arranged in one line, are adjacently disposed as a driving circuit line. Further, the power supply wiring line 301 is provided below the driving transistors TFT2 along the light-emitting elements 321, that is, the driving transistor TFT2, and the ground wiring line 302 is provided below the power supply wiring line 301 along the light-emitting elements 321 in a similar manner.

In addition, a ground contact part 302a and a back-side ground wiring line 302b are provided. The back-side ground wiring line 302b is provided on a backside of the substrate to be connected to the cathode electrode of each of the light-emitting elements 321. The ground contact part 302a connects the back-side ground wiring line 302b and the ground wiring line 302 on a surface of the substrate.

On the other hand, above the light-emitting elements 321, the retaining transistors TFT1, which are arranged in one line, are disposed as a holding circuit line. Further, data lines 312 are provided above the retaining transistors TFT1 along the light-emitting elements 321, that is, the retaining transistors TFT1, and the start signal line 304 and the clock signal line 305 are provided above the data lines 312 along the light-emitting elements 321 in the same manner as the data lines 312. Moreover, the number of the data lines 312 is the same as the number of light-emitting elements 321 constituting one block, that is, 128.

Between the start signal line 304 and the clock signal line 305, the shift registers 303 (selection circuit 30) are provided along the arrayed direction of the light-emitting elements 321. Further, between output stages of the respective shift registers 303 and the gate terminals of the respective retaining transistors TFT1, gate lines 306 (not shown) are respectively provided to bridge across the data lines, that is, are respectively provided on a different layer from the data lines 312.

Further, as described above, ESD protective elements 60 are respectively interposed in the data lines 312 and ESD protective elements 61 are respectively provided at front ends of the data lines 312. Specifically, each of the ESD protective elements 60 is interposed in the data line 312 provided in the left and right directions, that is, so as to be located before reaching the light-emitting element 321 from the left side of the substrate, as shown in the drawing, and each of the ESD protective elements 61 is disposed at the right side of the substrate, since the ESD protective elements 61 are to be provided at the front ends of the data lines 312.

Furthermore, although not shown, the lead lines 313 mentioned above are respectively provided between the data lines 312 and the retaining transistors TFT1. The lead lines 313 are provided on a layer different from the data lines so as to connect between the data lines and the retaining transistors TFT1 at the shortest distance, that is, in the vertical direction. In addition, the retaining transistors TFT1 and the driving transistors TFT2 are respectively provided at upper and lower sides, with the light-emitting elements 321 interposed therebetween. Accordingly, the drain terminal of the retaining transistor TFT1 and the gate terminal of the driving transistor TFT2 are connected by a connection wiring line (not shown) which is wired to bridge across the light-emitting element 321.

Figure 3:
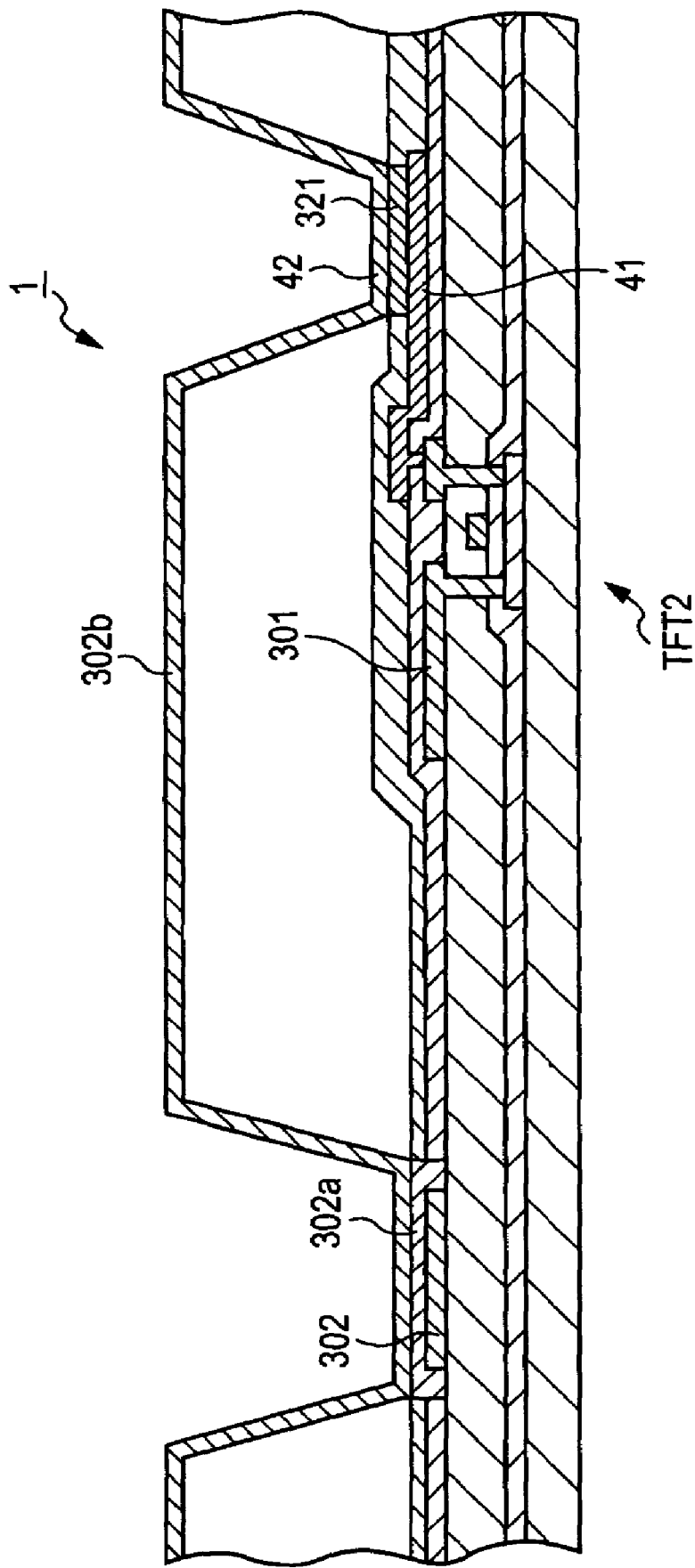
FIG. 3 is a cross-sectional view taken along the line A-A shown in FIG. 2.

FIG. 3 is a cross-sectional view taken along line A-A shown in FIG. 2. In addition, in FIG. 3, a back side of the line head 1 is shown as an upper side, and a surface side (a viewing side in FIG. 2) thereof is shown as a bottom side. Also, the retaining transistor TFT1 is omitted. As shown in the drawing, the line head 1 of the embodiment has a structure in which a luminous body of the organic EL light-emitting element (light-emitting element 321) is interposed between an anode terminal 41 (one electrode) and a cathode terminal 42 (the other electrode), and the anode terminal 41 is connected to the power supply wiring line 301 through the driving transistor TFT2 and the cathode terminal 42 is configured as a part of the back-side ground wiring line 302b. Further, in the line head 1 of the embodiment, the back-side ground wiring line 302b (cathode terminal 42) is made of a reflective-conductive material (for example, aluminum or calcium), and the anode terminal 41 is made of a transmissive-conductive material (for example, ITO (indium tin oxide)). On this account, when the light-emitting elements 321 emit light by supplying the power thereto, the emitted light therefrom is emitted from the anode terminal 41 side (surface side) of the line head 1.

According to the line head 1 of the present embodiment having such a configuration, the cathode terminal 42, that is, the back-side ground wiring line 302b is disposed opposite to the power supply wiring line 301. Therefore, it is possible to form a capacitor between the back-side ground wiring line 302b and the power supply wiring line 301, and as a result, a power supply can be stabilized.

Next, an image forming apparatus according to this embodiment, that is, an image forming apparatus using four line heads 11K, 11C, 11M and 11Y, each of which is the above-mentioned line head 1, will be described.

Figure 4:
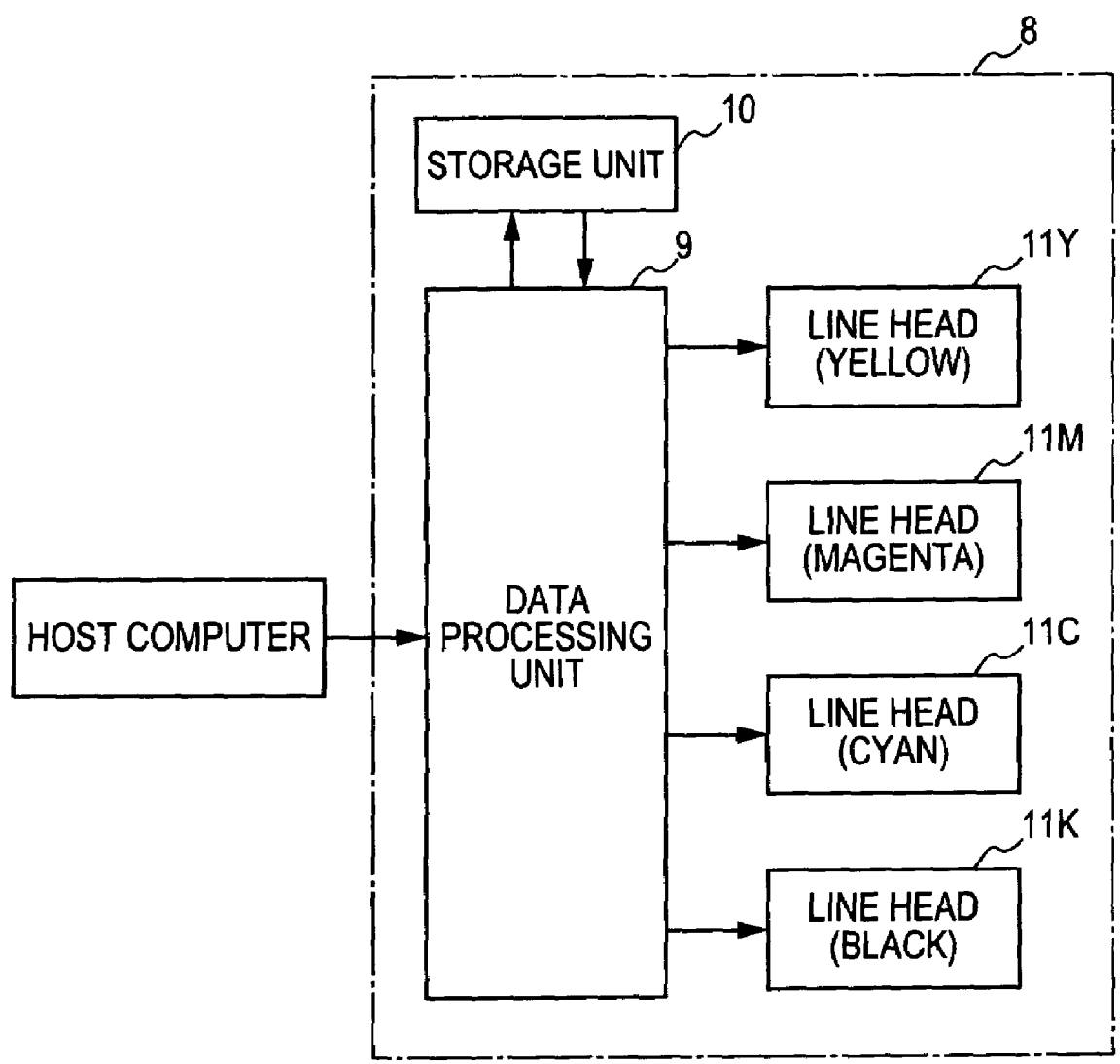
FIG. 4 is a block diagram showing image data processing by an image forming apparatus according to the first embodiment of the invention.

First, referring to a block diagram shown in FIG. 4, a functional configuration regarding image data processing carried out by the image forming apparatus will be described. A main controller, which controls the overall operation of the image forming apparatus, includes a data processing unit 9, which is composed of a CPU, an image processing circuit and the like, and a storage unit 10 which stores original image data and the like. Further, the image forming apparatus forms color images as well as monochrome images, and is provided with four line heads 11K, 11C, 11M, and 11Y each corresponding to 'black', 'cyan', 'magenta', and 'yellow', which are primary colors used for forming an image.

Here, the letters K, C, M, and Y appended to the ends of the reference numerals of the line heads 11K, 11C, 11M, and 11Y, stand for black, cyan, magenta, and yellow, respectively, which are primary colors used for forming an image. Such letters K, C, M, and Y can be similarly appended with respect to other members to be described below.

The data processing unit 9 reads original image data (bit map data), which is transmitted to the image forming apparatus from an external host computer and is stored in the storage unit 10, and then performs screen processing, color conversion processing, data conversion processing, and data transmission processing. The screen processing is performed to secure gray-scale reproducibility by matching with the processing conditions of the image forming apparatus, and is processing in which a line pattern, an error diffusion pattern, a halftone dot pattern, and the like are combined together. The color conversion processing converts the screen-processed image data into data that is separated into colors corresponding to each of the line heads 11K, 11C, 11M, and 11Y. The data conversion processing converts color-conversion-processed image data into data signals to be transmitted to each of the line heads 11K, 11C, 11M, and 11Y. The data transmission processing is for transmitting the transmission data signals to each of the line heads 11K, 11C, 11M, and 11Y.

Figure 5:
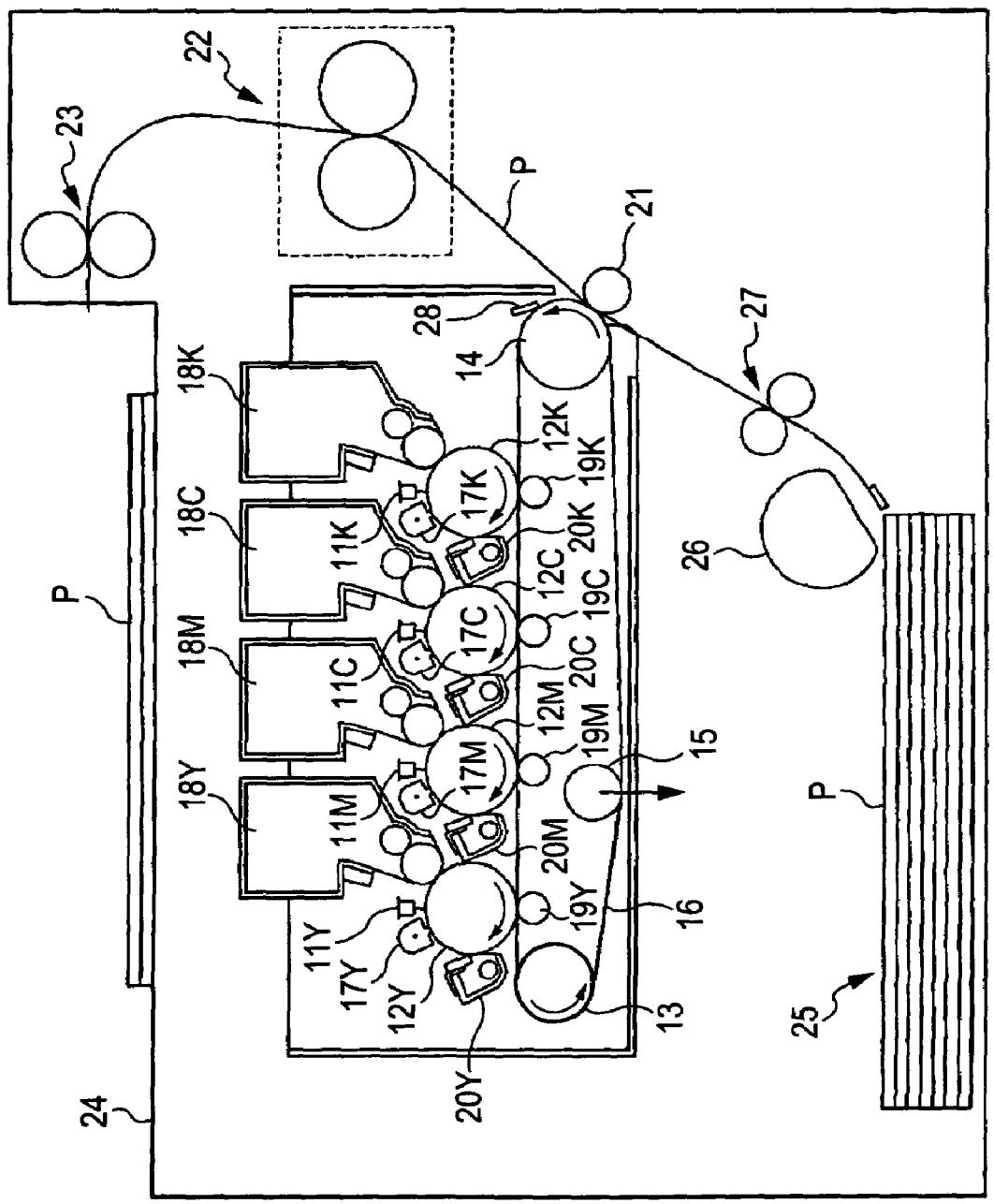
FIG. 5 is a cross-sectional view illustrating a mechanical configuration of the image forming apparatus according to the first embodiment of the invention.

FIG. 5 is a vertical sectional side view illustrating a mechanical configuration of the image forming apparatus according to this embodiment. In the image forming apparatus, four line heads 11K, 11C, 11M, and 11Y having the same configuration are respectively arranged in exposing positions of the corresponding four photoconductor drums 12K, 12C, 12M, and 12Y having the same configuration. This configuration is referred to as a tandem-type image forming apparatus.

The image forming apparatus includes a driving roller 13, a driven roller 14, a tension roller 15, and an intermediate transfer belt 16 which is suspended by tension applied by the tension roller 15 and is driven to be rotated in the direction of the arrows shown in FIG. 5 (counterclockwise direction). The photoconductor drums 12K, 12C, 12M, and 12Y, serving as four image carriers, each having a photosensitive layer on the outer peripheral surface thereof, are arranged at a predetermined interval with respect to the intermediate transfer belt 16.

The photoconductor drums 12K, 12C, 12M, and 12Y are driven to rotate in the direction of the arrows shown in FIG. 5 (clockwise direction) in synchronization with the driving of the intermediate transfer belt 16. In addition, corona chargers 17K, 17C, 17M, and 17Y for uniformly charging the outer peripheral surfaces of the respective photoconductor drums 12K, 12C, 12M, and 12Y, and the line heads 11K, 11C, 11M, and 11Y for sequentially scanning the outer peripheral surfaces charged uniformly by the corona chargers 17K, 17C, 17M, and 17Y in synchronization with rotations of the photoconductor drums 12K, 12C, 12M, and 12Y are provided on the periphery of the respective photoconductor drums 12K, 12C, 12M, and 12Y.

Further, developers 18K, 18C, 18M, and 18Y for applying toner, serving as a developing agent, onto electrostatic latent images formed by the line heads 11K, 11C, 11M, and 11Y in order to convert the images into toner images, primary transfer rollers 19K, 19C, 19M, and 19Y, each serving as a transfer device for sequentially transferring the toner images developed by the developers 18K, 18C, 18M, and 18Y onto the intermediate transfer belt 16, and cleaners 20K, 20C, 20M, and 20Y for removing toner remaining on the surfaces of the photoconductor drums 12K, 12C, 12M, and 12Y after the transfer are provided on the periphery of the respective photoconductor drums 12K, 12C, 12M, and 12Y.

Here, each of the line heads 11K, 11C, 11M, and 11Y is fixed in the image forming apparatus so that the arrayed direction of the organic EL light-emitting elements is parallel to buses of the respective photoconductor drums 12K, 12C, 12M, and 12Y. Further, the peak wavelengths of emission energy emitted from the line heads 11K, 11C, 11M, and 11Y are set to be approximately equal to the peak wavelengths of sensitivity of the respective photoconductor drums 12K, 12C, 12M, and 12Y.

In the developers 18K, 18C, 18M, and 18Y, for example, a single-nonmagnetic-component toner is used as the developing agent. The single-component developing agent is transported to a developing roller by a feeding roller or the like, and the film thickness of the developing agent attached to the surface of the developing roller is restricted by a control blade. Then, the developing roller is brought into contact with or pressed against the respective photoconductor drums 12K, 12C, 12M, and 12Y to cause the developing agent to be adhered thereto depending on the electrical potential levels of the respective photoconductor drums 12K, 12C, 12M, and 12Y. A toner image is thus developed.

The four toner images of black, cyan, magenta, and yellow generated by the four single-color toner image forming stations are primary-transferred sequentially onto the intermediate transfer belt 16 by a primary transfer bias applied to each primary transfer roller 19K, 19C, 19M, and 19Y. Then, a full-color toner image generated by superimposing these single-color toner images on the intermediate transfer belt 16 is secondary-transferred onto a recording medium P, such as a paper, by a secondary transfer roller 21. The secondary-transferred image is then fixed on the recording medium P by passing it through a pair of photographic fixing rollers 22, serving as photographic fixing units, and the recording medium P is finally ejected by a pair of sheet-discharging rollers 23 onto a sheet-discharging tray 24 provided at the top portion of the apparatus. In addition, the secondary transfer roller 21 forms a secondary transfer portion between the secondary transfer roller 21 and the intermediate transfer belt 16.

Further, in this mechanical configuration, reference numeral 25 denotes a sheet-feeding cassette having a large number of recording media P therein, and reference numeral 26 denotes a pick-up roller for feeding the recording media P from the feeding cassette 25 one by one. Reference numeral 27 denotes a pair of gate rollers for regulating the feeding timing of the recording medium P toward the secondary transfer portion of the secondary transfer roller 21, and reference numeral 28 denotes a cleaning blade for removing toner remaining on the surface of the intermediate transfer belt 16 after the secondary transfer.

According to such an image forming apparatus, the line head 1 according to the present embodiment is used, so that it is possible to stabilize the power in the line head 1. As a result, it is possible to prevent trouble from occurring and to realize a stable operation.

Second Embodiment

Next, a second embodiment of the invention will be described with reference to FIG. 6. In the second embodiment, a description of the same parts as those in the first embodiment will be omitted.

Figure 6:
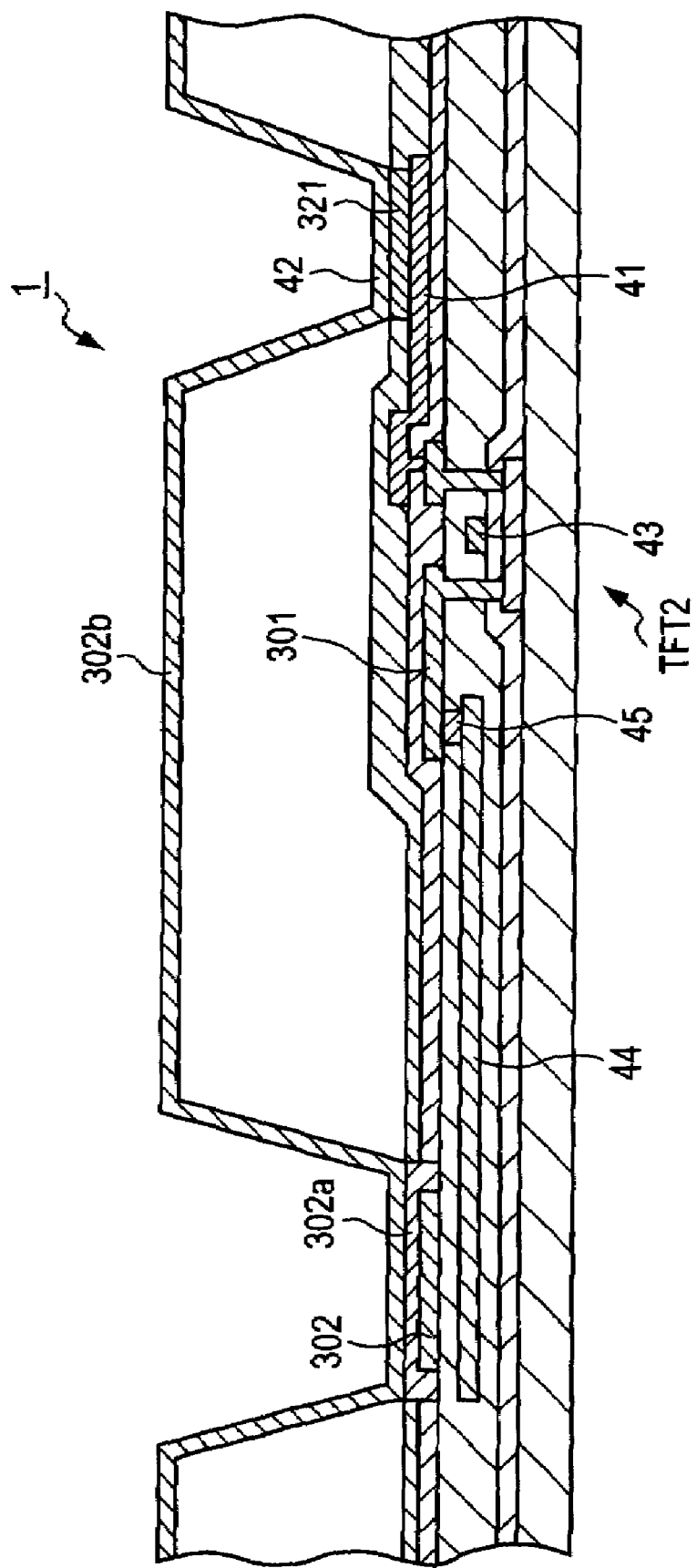
FIG. 6 is a partially sectional view illustrating a line head according to a second embodiment of the invention.

FIG. 6 is a partially sectional view of a line head 1 of the second embodiment, and illustrates the same parts as those in FIG. 3 used to describe the first embodiment.

As shown in FIG. 6, in the line head 1 of the second embodiment, gate-terminal-layer wiring lines 44 are formed on the same layer as gate terminals 43 of driving transistors TFT2, and the gate-terminal-layer wiring lines 44 are connected to a power supply wiring line 301 through contact portions 45. In addition, the gate-terminal-layer wiring lines 44 and the gate terminals 43 are formed on the same layer, as described above, and are also formed in a non-connection state.

As known in the related art, a capacitor has a larger capacitance as conductive layers opposite to each other are wider. From such a point of view, the power supply wiring line 301 is formed such that the area defined by the power supply wiring line 301 is approximately equal to the area defined by the back side ground wiring line 302b shown in FIG. 2, and thus the capacitance of a capacitor formed between the back side ground wiring line 302b and the power supply wiring line 301 becomes large. Accordingly, it is possible to improve stabilization of the power. However, as shown in FIG. 2, for the line head 1, the back side ground wiring line 302b is arranged adjacent to the power supply wiring line 301 on the same layer as the power supply wiring line 301, so that it is difficult to form the power supply wiring 301 having a wider area.

For that reason, in the present embodiment, the gate-terminal-layer wiring lines 44, which are connected to the power supply wiring line 301 through the contact portion 45, are arranged on a lower layer than a layer where the power supply wiring line 301 or the ground wiring line 302 is formed. Accordingly, it is possible to widen a conductive layer opposite to the back-side ground wiring line 302b, thereby making the capacitance of the capacitor large. As a result, according to the line head 1 of the second embodiment, it is possible to improve stabilization of the power.

In addition, the gate-terminal-layer wiring lines 44 can be easily formed with the same process as the gate terminal 43.

Further, the invention is not limited to the above embodiments. For example, the following modifications may be considered:

(1) In the embodiments, although the driving transistor (TFT) has been used as a driving circuit, the driving circuit of the invention is not limited thereto. Other circuits may be used if it can drive each light-emitting element;

(2) In the embodiments, although the organic EL light-emitting element has been used as a light-emitting element, the light-emitting element of the invention is not limited thereto. For example, an LED (light-emitting diode) may be used as a light-emitting element; and (3) In the embodiments, although the tandem-type image forming apparatus has been described, the invention is not limited thereto.

What is claimed is:

1. A line head comprising:
   a light-emitting element line in which a plurality of light-emitting elements, each of the plurality of light-emitting elements being interposed between a first electrode and a second electrode, are arranged;
   driving circuits that drive the plurality of light-emitting elements on the light-emitting element line, respectively,
   a power supply wiring line connected to the first electrode through each of the driving circuits; and
   a ground wiring line connected to the second electrode,
   at least a part of the power supply wiring line overlapping the ground wiring line in parallel in plan view forming a capacitor to stabilize the power supply wiring line.

2. The line head according to claim 1,
   wherein thin film transistors are used as the driving circuits,
   the power supply wiring line is connected to a gate-terminal-layer wiring line formed on the same layer as gate terminals of the thin film transistors, and
   at least a part of the gate-terminal-layer wiring line overlapping the ground wiring line in plan view.

3. The line head according to claim 1,
   wherein organic EL light-emitting elements are used as the light-emitting elements.

4. An image forming apparatus comprising:
   photoconductors;
   charging units that uniformly charge the photoconductors;
   exposing units that include the line head according to claim 1 and that expose the photoconductors, thereby forming, on the photoconductors, electrostatic latent images of images to be formed;
   developing units that develop the electrostatic latent images formed on the photoconductors as toner images;
   transfer units that transfer the toner images formed on the photoconductors onto a transfer medium; and
   photographic fixing units that fix the toner image formed on the transfer medium.

5. The image forming apparatus according to claim 4, wherein color images are formed.

6. The line head according to claim 1, the driving circuits including a plurality of driving transistors which are arranged in one line, wherein at least one driving transistor of the plurality of driving transistors overlaps the ground wiring line in plan view.

7. A line head comprising:
   a light-emitting element line in which a plurality of light-emitting elements, each being interposed between one electrode and another electrode, are arranged;
   driving circuits that drive the plurality of light-emitting elements on the light-emitting element line, respectively; and
   a power supply wiring line connected to the one electrode through each of the driving circuits,
   wherein thin film transistors are used as the driving circuits,
   the power supply wiring line is connected to a gate-terminal-layer wiring line formed on the same layer as gate terminals of the thin film transistors, and
   at least a part of the gate-terminal-layer wiring line overlapping the other electrode in parallel in plan view forming a capacitor to stabilize the gate-terminal-layer wiring line.

* * * * *